(12) United States Patent
Hammer et al.

(10) Patent No.: US 9,972,514 B2
(45) Date of Patent: May 15, 2018

(54) APPARATUS FOR LIQUID TREATMENT OF WAFER SHAPED ARTICLES

(71) Applicant: LAM RESEARCH AG, Villach (AT)

(72) Inventors: Dietmar Hammer, Treffen (AT); Reinhold Schwarzenbacher, Reisseck (AT); Milan Pliska, Villach (AT); Bridget Hill, Villach (AT); Michael Brugger, Millstatt (AT)

(73) Assignee: LAM RESEARCH AG (AT)

( * ) Notice: Subject to any disclaimer, the term of this patent is extended or adjusted under 35 U.S.C. 154(b) by 0 days. days.

(21) Appl. No.: 15/063,349

(22) Filed: Mar. 7, 2016

(65) Prior Publication Data
US 2017/0256433 A1    Sep. 7, 2017

(51) Int. Cl.
*H01L 21/67*    (2006.01)
*B08B 3/10*     (2006.01)
*H01L 21/687*   (2006.01)

(52) U.S. Cl.
CPC ........ *H01L 21/67115* (2013.01); *B08B 3/10* (2013.01); *H01L 21/67051* (2013.01); *H01L 21/68728* (2013.01)

(58) Field of Classification Search
CPC ......... H01L 21/68728; H01L 21/68742; H01L 21/67115; B08B 7/0071
See application file for complete search history.

(56) References Cited

U.S. PATENT DOCUMENTS

| | | |
|---|---|---|
| 4,903,717 A | 2/1990 | Sumnitsch |
| 5,513,668 A | 5/1996 | Sumnitsch |
| 5,989,342 A * | 11/1999 | Ikeda ............. B05C 11/08 118/319 |
| 6,435,200 B1 | 8/2002 | Langen |
| 6,536,454 B2 | 3/2003 | Lindner |
| 7,503,978 B2 | 3/2009 | Miya et al. |
| 7,837,803 B2 | 11/2010 | Hohenwarter |
| 7,891,314 B2 | 2/2011 | Pichler |
| 8,029,641 B2 | 10/2011 | Baldy et al. |
| 8,596,623 B2 | 12/2013 | Frank et al. |

(Continued)

FOREIGN PATENT DOCUMENTS

| | | |
|---|---|---|
| WO | 2004/084278 A1 | 9/2004 |
| WO | 2006/008236 A1 | 1/2006 |
| WO | WO-2006/125744 A1 | 11/2006 |

OTHER PUBLICATIONS

U.S. Appl. No. 15/230,254, filed Aug. 5, 2016, Kon et al.
U.S. Appl. No. 15/285.894, filed Oct. 5, 2016, Kon et al.

*Primary Examiner* — Marc Lorenzi

(57) ABSTRACT

An apparatus for treating a wafer-shaped article comprises a spin chuck configured to hold a wafer-shaped article of a predetermined diameter in a position wherein a lower surface of the wafer-shaped article is spaced a predetermined distance from an upper surface of the spin chuck. A treatment assembly is mounted above the upper surface of the spin chuck and underlying a wafer-shaped article when mounted on the spin chuck. The treatment assembly extends parallel to the upper surface from an axis of rotation of the spin chuck radially to a distance that is at least half the predetermined diameter. The spin chuck comprises upwardly projecting gripping pins configured to hold a wafer-shaped article in position, wherein the gripping pins do not pass through the treatment assembly.

13 Claims, 2 Drawing Sheets

(56) References Cited

U.S. PATENT DOCUMENTS

| | | | |
|---|---|---|---|
| 8,821,681 B2 | 9/2014 | Puggl et al. | |
| 2004/0060513 A1* | 4/2004 | Kojima | C23C 16/4585 118/715 |
| 2008/0189975 A1* | 8/2008 | Miya | H01L 21/68728 34/317 |
| 2012/0328273 A1* | 12/2012 | Kawano | H05B 3/0033 392/418 |
| 2013/0061873 A1 | 3/2013 | Hohenwarter et al. | |
| 2014/0054280 A1* | 2/2014 | Hohenwarter | H01L 21/67051 219/392 |
| 2014/0090669 A1* | 4/2014 | Hinode | B08B 7/0071 134/19 |
| 2014/0102637 A1* | 4/2014 | Brugger | H01L 21/67051 156/345.23 |
| 2014/0339215 A1* | 11/2014 | Plazonic | H01L 21/67115 219/389 |
| 2015/0243542 A1* | 8/2015 | Yoshihara | H01L 21/68764 156/345.15 |
| 2015/0258553 A1* | 9/2015 | Kobayashi | H01L 21/67028 427/372.2 |
| 2015/0270146 A1* | 9/2015 | Yoshihara | H01L 21/67028 134/18 |

* cited by examiner

APPARATUS FOR LIQUID TREATMENT OF WAFER SHAPED ARTICLES

BACKGROUND OF THE INVENTION

1. Field of the Invention

The invention relates to a method and apparatus for liquid treatment of wafer-shaped articles.

2. Description of Related Art

Liquid treatment includes both wet etching and wet cleaning, wherein the surface area of a wafer to be treated is wetted with a treatment liquid and a layer of the wafer is thereby removed or impurities are thereby carried off. A device for liquid treatment is described in U.S. Pat. No. 4,903,717. In this device the distribution of the liquid may be assisted by the rotational motion imparted to the wafer.

Many of the processes performed on such devices require heat to be applied to the wafer. Commonly-owned copending application US 2013/0061873 describes such a device in which a heating assembly is mounted in a stationary manner on a central post about which a rotary chuck rotates. A wafer is held on this device above the heating assembly by a series of gripping pins that project upwardly from the periphery of the chuck. Consequently, the heating assembly must be positioned entirely within the central region delimited by the pin assemblies, which limits the ability of the heating assembly to heat the wafer at its outer edge region.

SUMMARY OF THE INVENTION

Thus, in one aspect, the present invention relates to an apparatus for treating a wafer-shaped article, comprising a spin chuck configured to hold a wafer-shaped article of a predetermined diameter in a position wherein a lower surface of the wafer-shaped article is spaced a predetermined distance from an upper surface of the spin chuck. A treatment assembly is mounted above the upper surface of the spin chuck and underlying a wafer-shaped article when mounted on the spin chuck. The treatment assembly extends parallel to the upper surface from an axis of rotation of the spin chuck radially to a distance that is at least half the predetermined diameter. The spin chuck comprises upwardly projecting gripping pins configured to hold a wafer-shaped article in position, wherein the gripping pins do not pass through the treatment assembly.

In preferred embodiments of the apparatus according to the present invention, the treatment assembly is stationary in relation to rotation of the spin chuck.

In preferred embodiments of the apparatus according to the present invention, the spin chuck comprises a stationary central post and a chuck body rotatably mounted on the stationary central post.

In preferred embodiments of the apparatus according to the present invention, the treatment assembly is rigidly secured to an upper end of the stationary central post.

In preferred embodiments of the apparatus according to the present invention, the gripping pins are mounted for pivotal movement relative to the spin chuck about respective vertical axes, at least one of the vertical axes intersecting the treatment assembly.

In preferred embodiments of the apparatus according to the present invention, the gripping pins each comprise a lower portion underlying the treatment assembly, an intermediate portion positioned radially outside of the treatment assembly, and an upper portion including a gripping end that overlies the treatment assembly.

In preferred embodiments of the apparatus according to the present invention, each of the gripping pins is mounted for pivotal movement relative to the spin chuck about a respective vertical axis that passes through the upper and lower portions of the gripping pin but does not pass through the intermediate portion.

In preferred embodiments of the apparatus according to the present invention, each of the gripping pins is configured for pivoting movement between a closed position in which the gripping end occupies a radially innermost position, and an open position in which the gripping end occupies a radially outermost position.

In preferred embodiments of the apparatus according to the present invention, a peripheral region of the treatment assembly is positioned between the upper and lower portions of the gripping pins, and an outer periphery of the treatment assembly is oriented parallel to the intermediate portions.

In preferred embodiments of the apparatus according to the present invention, the treatment assembly extends parallel to the upper surface over a distance that is greater than or equal to the predetermined diameter.

In preferred embodiments of the apparatus according to the present invention, the treatment assembly is a heater.

In preferred embodiments of the apparatus according to the present invention, the heater comprises LED heating elements.

In preferred embodiments of the apparatus according to the present invention, the heater comprises one or more infrared heating elements.

In preferred embodiments of the apparatus according to the present invention, the central post comprises at least one conduit communicating with an interior of the treatment assembly.

In preferred embodiments of the apparatus according to the present invention, a ring gear is in meshing engagement with all of the gripping pins, such that relative rotation between the spin chuck and the ring gear pivots the gripping pins in unison about their respective vertical axes.

In another aspect, the present invention relates to a gripping pin for use in an apparatus for treating a wafer-shaped article, the gripping pin comprising a lower portion and an upper portion that are spaced apart from one another and which extend along a common axis. An intermediate portion interconnects the lower and upper portions, the intermediate portion being parallel to and offset from the common axis. The upper portion comprises a gripping end configured to contact and retain a peripheral edge of a wafer-shaped article.

In preferred embodiments of the gripping pin according to the present invention, the lower end comprises a gear mounted coaxially with the upper and lower portions.

In preferred embodiments of the gripping pin according to the present invention, the gripping end is positioned eccentrically in relation to the common axis.

In preferred embodiments of the gripping pin according to the present invention, the gripping end and the intermediate portion are positioned relative to one another and the common axis such that rotation of the gripping pin about the common axis causes the gripping end and the intermediate portion to move in opposite directions perpendicular to the common axis.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
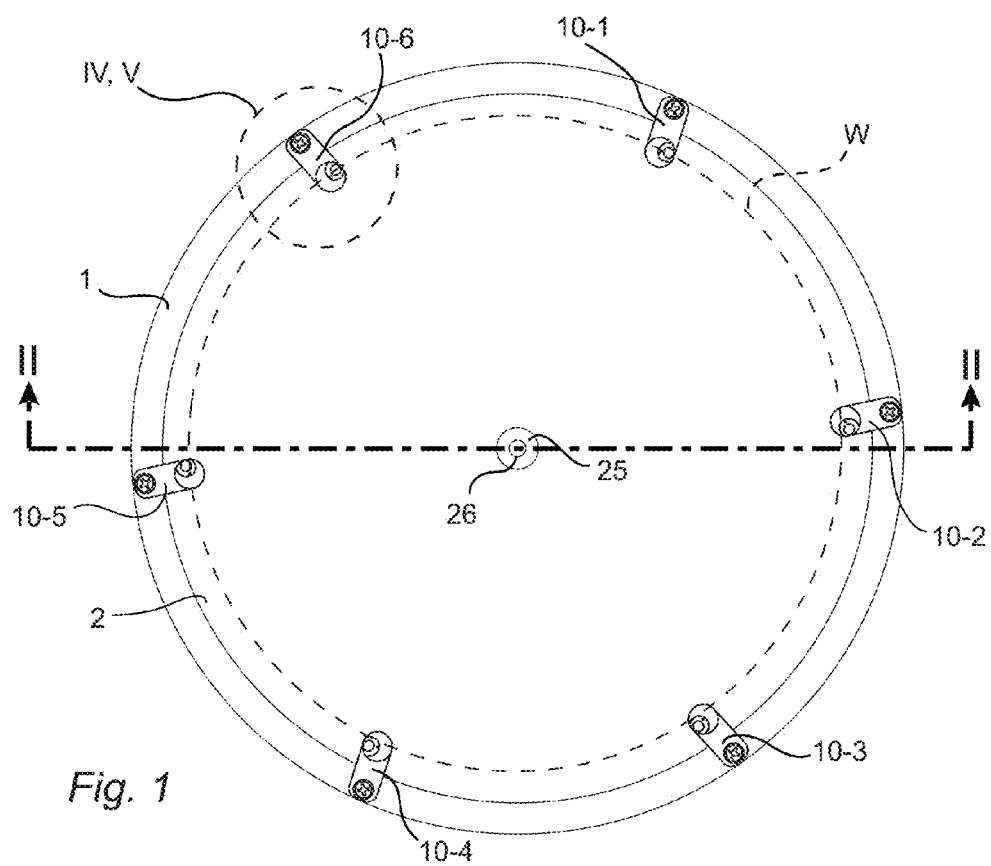
FIG. 1 is a top plan view of a chuck according to a first embodiment of the invention.
Figure 2:
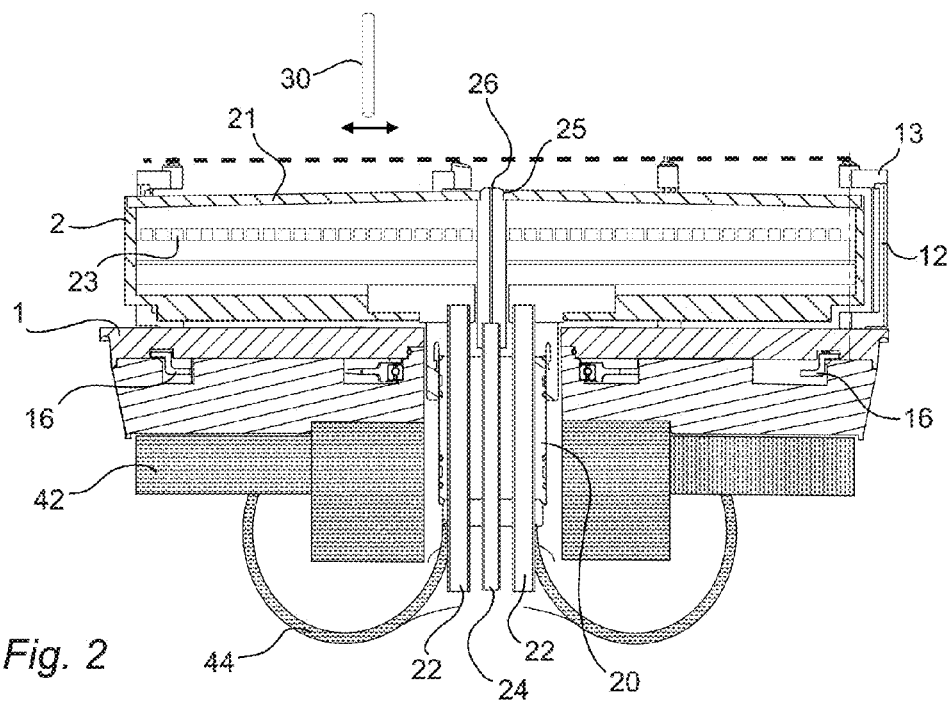
FIG. 2 is a partial axial section through the chuck depicted in FIG. 1, taken along the line II-II of FIG. 1, with a wafer in position as indicated in broken line.

Referring now to the drawings, FIGS. 1 and 2 depict a spin chuck 1 that holds a wafer W thereon in a predetermined orientation, which is preferably such that the major surfaces of disposed horizontally or within ±20° of horizontal. Spin chuck 1 may for example be a chuck that operates according to the Bernoulli principle, as described for example in U.S. Pat. No. 4,903,717.

Chuck 1 includes a series of gripping pins, which in this embodiment are six in number, designated 10-1 through 10-6. Gripping pins 10-1 to 10-6 prevent the wafer from sliding laterally off the chuck. In this embodiment, the upper portions of gripping pins 10-1 to 10-6 also provide subjacent support for wafer W, and thus the chuck need not operate according to the Bernoulli principle and need not be adapted to supply a gas cushion beneath wafer. In particular, each gripping pin comprises an uppermost gripping portion 14 that extends vertically from the pin body, generally along an axis that is offset in relation to the rotation axis A of the overall gripping pin. The upper gripping portions furthermore each comprise a lateral recess or cut-out that is designed to accommodate the peripheral edge of a wafer.

Although not shown in the figures, the spin chuck may be surrounded by a process chamber, which may be a multi-level process chamber as described in commonly-owned U.S. Pat. No. 7,837,803 (corresponding to WO 2004/084278). The spin chuck can be positioned at the selected level by moving the chuck axially relative to the stationary surrounding chamber, or by moving the surrounding chamber axially relative to the axially-stationary chuck, as described in connection with FIG. 4 of U.S. Pat. No. 6,536,454.

Chuck 1 furthermore comprises a heating assembly 2 for heating the underside of a wafer mounted on the chuck. Heating assembly 2 is integrated with a stationary post 20 comprising a nozzle head that supplies fluid to the downwardly-facing side of the wafer W.

Heating assembly 2 comprises a housing incorporating a multiplicity of LED heating elements 23, which are preferably arranged in a two-dimensional array that is coextensive with the downwardly-facing surface of the wafer W. It will be noted that the chuck 1 is designed to hold a wafer of a single standard diameter, such as a 300 mm or 450 mm diameter wafer.

The stationary post 20 incorporates conduits 22 for supplying a cooling liquid to the interior of the housing of the heating assembly, and a conduit 24 for supplying a gas, such as nitrogen gas, to the underside of wafer W. Conduit 24 therefore connects to conduit 25, which traverses the heating assembly 2, and which includes a discharge orifice 26 that opens on the upper face of heating assembly 2.

As can be seen in FIG. 2, the housing of heating assembly 2 extends radially outwardly beyond the peripheral edge of the wafer W, which is not possible for the device described in US 2013/0061873. It is possible for the present invention because of the special shape of the gripping pins 10-1 through 10-6.

Figure 3:
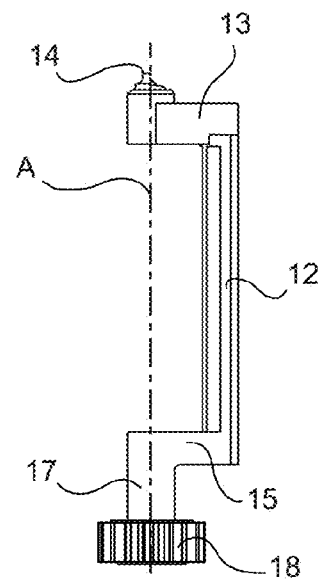
FIG. 3 shows a gripping pin according to an embodiment of the present invention.

Specifically, each gripping pin has the overall shape of a crank, as can be seen in FIGS. 2 and 3, such that the pin pivots relative to the body of chuck 1 about an axis A, but comprises an intermediate vertical portion 12 that is parallel to and offset from the axis A. As shown in FIG. 3, the gripping pins each have a base 18 which is a gear that engages with the common ring gear 16, that is, ring gear 16 is in continuous meshing engagement with the gears 18 of all of the gripping pins 10-1 through 10-6. Each gripping pin is journaled for rotation relative to chuck 1 via the lower portion 17, which passes through the chuck body.

The structure and operation of the gear base 18 and common ring gear 16 may for example be as described in U.S. Pat. No. 4,903,717. Above the upper surface of the chuck 1, however, the novel shape of the gripping pins 10-1 through 10-6 allows the heating assembly 2 to be dimensioned so as to underlie the full diameter of the wafer W.

Specifically, the offset portion 12 interconnects the lower horizontal portion 15 and the upper horizontal portion 13 of each gripping pin. The gripping element 14 projects upwardly from the gripping pin and is eccentric in relation to the axis of rotation A of the gripping pin.

Thus, as the gripping pins 10-1 through 10-6 are pivoted in unison about their respective axes A, which occurs when the common ring gear rotates over a limited angular range relative to chuck 1, the gripping portion will be moved either radially outwardly to a position in which they release a wafer W, or radially inwardly to a position in which they engage the peripheral edge of a wafer W.

Figure 4:
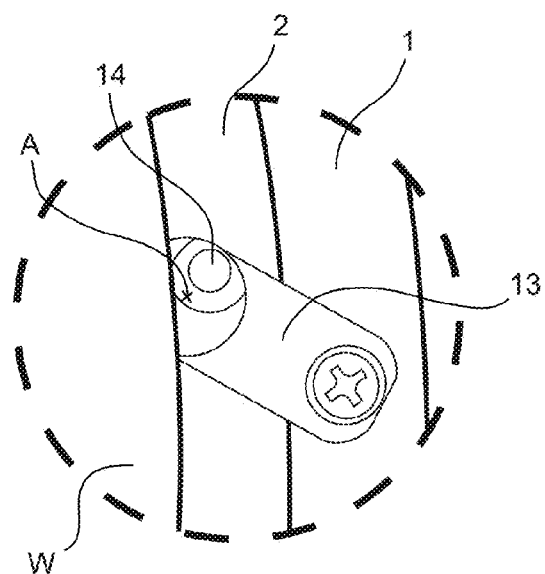
FIG. 4 is an enlarged view of the detail IV designated in FIG. 1, when the gripping pins are not engaging a wafer.
Figure 5:
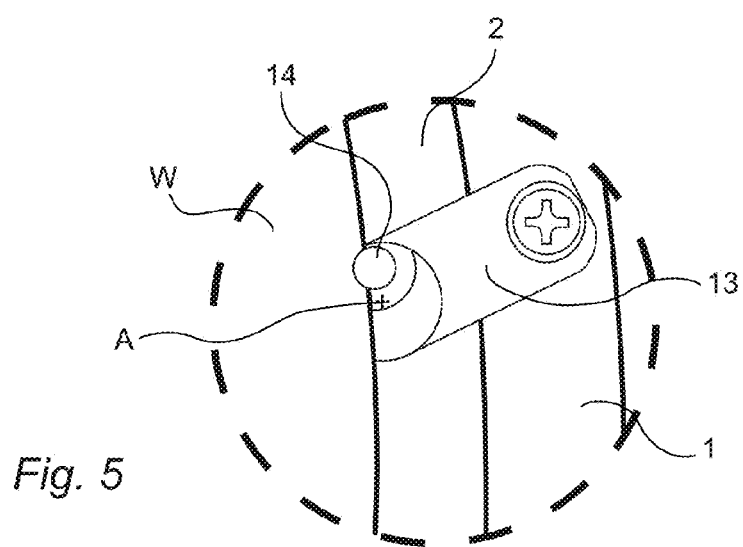
FIG. 5 is an enlarged view of the detail V designated in FIG. 1, when the gripping pins are engaging a wafer.

For example, the detail of FIG. 4 shows the case in which the gripping portions 14 of each of the gripping pins 10-1 through 10-6 has been moved radially outwardly to a position in which the wafer W is not engaged, for loading and unloading of a wafer W from the apparatus. In the detail of FIG. 5, the gripping pin has been rotated counterclockwise about its axis A from the position shown in FIG. 4, which causes the gripping portion 14 to move radially inwardly and engage the peripheral edge of wafer W.

With reference to FIG. 2, it will be appreciated that this movement between the positions shown in FIGS. 4 and 5 occurs without the gripping pins 10-1 through 10-6 contacting the heating assembly 2, by virtue of the crank shape of the gripping pins. Nevertheless, the axis of rotation A of each of the gripping pins 10-1 through 10-6 passes through the heating assembly 2 in this embodiment.

Heating assembly 2 is integrated with the stationary post 20 that forms the dispensing assembly of this embodiment. As shown in greater detail in FIG. 2, the dispensing assembly comprises a non-rotating (stationary) post 20 whose nozzle 25 penetrate the cover of the heating assembly. FIG. 2 also shows that the heating assembly 2 is mounted in a cantilever fashion such that it is spaced from both the overlying wafer W as well as from the rotating upper surface of chuck 1.

Spin chuck 1 is mounted to the rotor of a hollow-shaft motor 42 (schematically shown in FIG. 2), and the stationary post 20 penetrates through a central opening of the spin chuck 1. The stator of the hollow-shaft motor 42 is mounted to a mounting plate, which is in turn mounted to a stationary frame 44 of the apparatus, to which the stationary post 20 is also mounted.

An upper liquid dispenser 30 supplies treatment liquid from above, and can incorporate a plurality of different liquid dispensing nozzles for dispensing a variety of different treatment liquids, as described for example in commonly-owned U.S. Pat. No. 7,891,314 (corresponding to WO 2006/008236). Upper liquid dispenser 30 is preferably displaceable radially of the wafer W, to aid in spreading treatment liquid over the entire upwardly facing surface of wafer W as it is rotated on the spin chuck.

The housing of heating assembly 2 is covered by a plate 21 of material that has high transparency (i.e., high transmission) to the radiation generated by the LED elements 23. Preferably, plate 21 is formed from quartz glass. Plate 18 preferably forms a liquid-tight seal with the housing of heating assembly 2, to exclude process liquids such as hot isopropyl alcohol from the housing where they might otherwise contact LED elements 23.

It will be appreciated that the heating assembly 2 could instead be a different type of treatment unit for which full coverage of the wafer W is desired. It will also be appreciated that the treatment unit or heating assembly 2 need not extend radially outwardly to or beyond the edge of the wafer W over the full circumference of the wafer W, because the treatment unit 2 is stationary and thus as the chuck 1 rotates the entire downwardly facing surface of the wafer W will be treated by the treatment unit 2 so long as it extends to the outer edge of the wafer W in at least one circumferential region of the wafer W.

A significant benefit of the apparatus and novel gripping pin structure described above is that they permit an LED heater to be used in an open spin chuck station, that is, one that is not kept in a sealed process chamber.

A further significant benefit of the apparatus and novel gripping pin structure described above is that they permit an existing chuck (such as that described in US 2013/0061873 to be retrofitted by replacing only the heating assembly and gripping pins, without the need to replace or modify the spin chuck 1 or the drive system for the gripping pins comprising the ring gear 16. The stationary post 20 can be relatively easily adapted for use with the heating assembly or other treatment unit 2 described herein, for example by proving power and control lines to the LED heating element that traverse the interior of the stationary post 20.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. An apparatus for treating a wafer-shaped article, comprising:
    a spin chuck configured to hold a wafer-shaped article of a predetermined diameter in a position wherein a lower surface of the wafer-shaped article is spaced a predetermined distance from an upper surface of the spin chuck; and
    a treatment assembly mounted above said upper surface of said spin chuck and underlying a the wafer-shaped article when mounted on the spin chuck, the treatment assembly extending parallel to said upper surface from an axis of rotation of said spin chuck radially to a distance that is at least half said predetermined diameter;
    said spin chuck comprising upwardly projecting gripping pins configured to hold a the wafer-shaped article in said position, wherein said gripping pins do not pass through said treatment assembly,
    wherein said gripping pins are mounted for pivotal movement relative to said spin chuck about respective vertical axes, at least one of said vertical axes intersecting said treatment assembly.

2. The apparatus according to claim 1, wherein the treatment assembly is stationary in relation to rotation of said spin chuck.

3. The apparatus according to claim 1, wherein said spin chuck comprises a stationary central post and a chuck body rotatably mounted on said stationary central post.

4. The apparatus according to claim 3, wherein said treatment assembly is rigidly secured to an upper end of said stationary central post.

5. The apparatus according to claim 1, wherein said gripping pins each comprise a lower portion underlying said treatment assembly, an intermediate portion positioned radially outside of said treatment assembly, and an upper portion including a gripping end that overlies said treatment assembly.

6. The apparatus according to claim 5, wherein each of said gripping pins is mounted for pivotal movement relative to said spin chuck about a their respective vertical axis that passes through said upper and lower portions of said gripping pin but does not pass through said intermediate portion.

7. The apparatus according to claim 6, wherein each of said gripping pins is configured for pivoting movement between a closed position in which said gripping end occupies a radially innermost position with respect to said treatment assembly and said intermediate portion occupies a radially outermost position with respect to said treatment assembly, and an open position in which said gripping end occupies a radially outermost position with respect to said treatment assembly and said intermediate portion occupies a radially innermost position with respect to said treatment assembly.

8. The apparatus according to claim 5, wherein a peripheral region of said treatment assembly is positioned between said upper and lower portions of said gripping pins, and wherein an outer periphery of said treatment assembly is oriented parallel to said intermediate portions.

9. The apparatus according to claim 1, wherein said treatment assembly extends parallel to said upper surface over a distance that is greater than or equal to said predetermined diameter.

10. The apparatus according to claim 1, wherein said treatment assembly comprises LED heating elements.

11. The apparatus according to claim 1, wherein said treatment assembly comprises one or more infrared heating elements.

12. The apparatus according to claim 4, wherein said stationary central post comprises at least one conduit communicating with an interior of said treatment assembly.

13. The apparatus according to claim 1, further comprising a ring gear in meshing engagement with all of said gripping pins, such that relative rotation between said spin chuck and said ring gear pivots said gripping pins in unison about their respective vertical axes.

* * * * *